(12) United States Patent
Warren

(10) Patent No.: US 9,923,377 B2
(45) Date of Patent: Mar. 20, 2018

(54) ELECTRICAL TESTER

(71) Applicant: BRITISH TELECOMMUNICATIONS PUBLIC LIMITED COMPANY, London (GB)

(72) Inventor: John Warren, London (GB)

(73) Assignee: British Telecommunications Public Limited Company, London (GB)

(*) Notice: Subject to any disclaimer, the term of this patent is extended or adjusted under 35 U.S.C. 154(b) by 0 days.

(21) Appl. No.: 14/907,494

(22) PCT Filed: Aug. 9, 2013

(86) PCT No.: PCT/GB2013/000339
§ 371 (c)(1),
(2) Date: Jan. 25, 2016

(87) PCT Pub. No.: WO2015/019036
PCT Pub. Date: Feb. 12, 2015

(65) Prior Publication Data
US 2016/0156196 A1 Jun. 2, 2016

(51) Int. Cl.
H02J 4/00 (2006.01)
G08B 21/18 (2006.01)
G01R 31/36 (2006.01)
H02H 3/33 (2006.01)
H02H 7/18 (2006.01)

(52) U.S. Cl.
CPC ............ *H02J 4/00* (2013.01); *G01R 31/3679* (2013.01); *G08B 21/182* (2013.01); *H02H 3/335* (2013.01); *H02H 7/18* (2013.01)

(58) Field of Classification Search
CPC .......... H02J 4/00; H02J 13/00; G08B 21/182; H02H 7/18; H02H 3/335; H02H 3/334; G01R 31/3679
See application file for complete search history.

(56) References Cited

U.S. PATENT DOCUMENTS 6,775,562 B1    8/2004   Owens et al.
6,807,035 B1   10/2004   Baldwin et al.
6,831,819 B2 * 12/2004   Nemir ..................... H02H 3/05
                                                  324/424

(Continued)

FOREIGN PATENT DOCUMENTS

GB    2 332 341 A    6/1999

OTHER PUBLICATIONS

Yeaking, Mains Decoupling, http://www.yeakingpower.com/storage.html?mod=download&news_id=239&cate_id=44&dm=upload, p. 1.*

(Continued)

*Primary Examiner* — Brian Wilson
(74) *Attorney, Agent, or Firm* — Amy M. Salmela; Patterson Thuente Pedersen, P.A.

(57) ABSTRACT

An electrical equipment cabinet has a standby battery to supply current when a mains connection is not available. In normal operation the battery is maintained charged by the mains supply. In order to test the condition of the battery, a measuring system is arranged to operation in co-operation with a test of a residual current detection device, which temporarily disconnects the mains supply, thus measuring the condition of the battery, when under load.

9 Claims, 3 Drawing Sheets

(56) References Cited

U.S. PATENT DOCUMENTS

| | | | | |
|---|---|---|---|---|
| 2001/0040798 A1* | 11/2001 | Appelberg | ............ | G08B 7/062 362/20 |
| 2006/0039094 A1* | 2/2006 | Brucker | .................. | H02H 3/06 361/71 |
| 2008/0007879 A1* | 1/2008 | Zaretsky | ................ | H02H 3/335 361/42 |

OTHER PUBLICATIONS

International Search Report for PCT/GB2013/000339, dated Feb. 24, 2014, 2 pages.
Written Opinion of the International Searching Authority for PCT/GB2013/000339, dated Feb. 24, 2014, 6 pages.
Translation of Office Action for CN Patent Application No. 201380078736 4, dated Dec. 5, 2017, 11 pages.

* cited by examiner

ELECTRICAL TESTER

RELATED APPLICATIONS

The present application is a National Phase entry of PCT Application No. PCT/GB2013/000339, filed Aug. 9, 2013, which the contents of which is incorporated herein by reference in its entirety.

TECHNICAL FIELD

Embodiments relate to equipment cabinets of the kind used to house electrical equipment such as telecommunications connection points. The equipment cabinets are provided in order to protect the equipment from the weather, and also to prevent unauthorized interference.

BACKGROUND

A typical telecommunications cubicle is designed to hold a number of line cards (typically between four and six), each having 48 or 64 ports. The ports may be simple electrical connections but in modern "fiber to the cabinet" installations are the interface between the network-side optical fiber network and the "legacy" electrical connections to individual customer premises, and thus include optical/electrical transducers.

Such cabinets have a mains electrical power supply which powers the equipment within the cabinet. Typically, the power circuitry incorporates a residual current device (RCD—also known as "Ground Fault Circuit Interrupters") which will disconnect the active equipment from the mains power supply if certain electrical fault conditions are detected, specifically an imbalance between the current in the live and neutral connections to the power supply, indicative of a leakage of current to earth (ground). Such a leakage may also cause external metallic parts of the cabinet housing to become electrically live, such that a potentially fatal electrical shock may be delivered to a person touching it, so it is important that such a leakage is detected and the equipment shut down until the cause is identified and repaired.

The equipment cabinets are typically provided with backup batteries for use when an RCD activates, or the mains power supply is interrupted for some reason external to the equipment cabinet. The batteries are typically operating at a lower voltage than typical the mains electricity supplies so can be safely connected in circuit even if the RCD has been activated because of an earthing fault. It is difficult to monitor the condition of these batteries remotely as they are only connected in circuit in exceptional and unpredictable circumstances. If the condition of the batteries is inadequate then customer service may be lost in the event that mains power is interrupted or the RCD activated.

Health and Safety regulations dictate that the RCD should be physically checked periodically, which can impose a significant operational burden on the owner of the equipment. To reduce this burden, a tester has been developed which, periodically and without requiring the attendance of an operative, automatically tests the RCD, reports the test results to a remote location, and then resets the RCD.

SUMMARY

In a first aspect, embodiments provide an apparatus for installation in an electrical equipment cabinet, comprising: a connection to a mains electricity supply; a connection to a battery; a residual current detection device for monitoring the mains electricity connection and for disconnecting the mains electricity supply in the event of detection of an imbalance between the current detected in different parts of the mains electricity connection; a test actuator for triggering the residual detection device, such that the mains electricity supply is disconnected from the battery; an RCD monitor for monitoring the operation of the residual current detection device when activated by the test actuator and reporting it to a remote location; a battery condition detector for monitoring the battery connection to determine the condition of a battery connected thereto; and a control system for transmitting, to a remote location, a signal indicative of the battery condition detected by the battery condition detector when the test actuator has triggered the residual current detection device.

In another aspect, embodiments provide a method for operating electrical equipment, comprising activating a test actuator for a residual current detection device such that a mains electricity supply to the equipment is disconnected; and monitoring the operation of the residual current detection device; wherein, when the residual current detection device is activated, the equipment draws electrical power from a battery, the battery's condition is monitored whilst the equipment is drawing power from the battery, and a signal indicative of the battery condition is transmitted to a remote location.

In one advantageous embodiment, the battery condition is monitored over a period of time initiated by the operation of the test actuator, and an alarm signal is transmitted to a remote location if the battery condition falls below a threshold value within a pre-determined time period. In the embodiment to be described, the test actuator causes the residual current detection device to be reset after a predetermined interval has elapsed after its activation but, if the battery condition falls below a predetermined threshold value before that predetermined interval has elapsed, the control system resets the residual current detection device to reconnect the equipment to the mains electricity supply before that period has elapsed. This allows the battery condition to be tested for a slow deterioration in its condition without risking loss of power to the electrical equipment for the time it would take to establish this if in fact the battery has minimal charge or is not connected properly (or at all).

In one advantageous embodiment, a report is transmitted to a remote location in the event that the battery voltage falls below a threshold value within a pre-determined time period, or in the event of the residual current device failing to activate.

Embodiments recognize that the action of the remote RCD tester, which deliberately and predictably creates a condition where the cabinet has switched to battery power, is an opportunity to allow the battery to be remotely tested.

Provision may be made for an actuator to disconnect the mains electricity supply directly, to allow the battery to be tested in the event that the test actuator fails to operate the residual current detection device.

BRIEF DESCRIPTION OF THE DRAWINGS

Embodiments will now be described, by way of example, and with reference to the Figures, in which.

DETAILED DESCRIPTION

Figure 1:
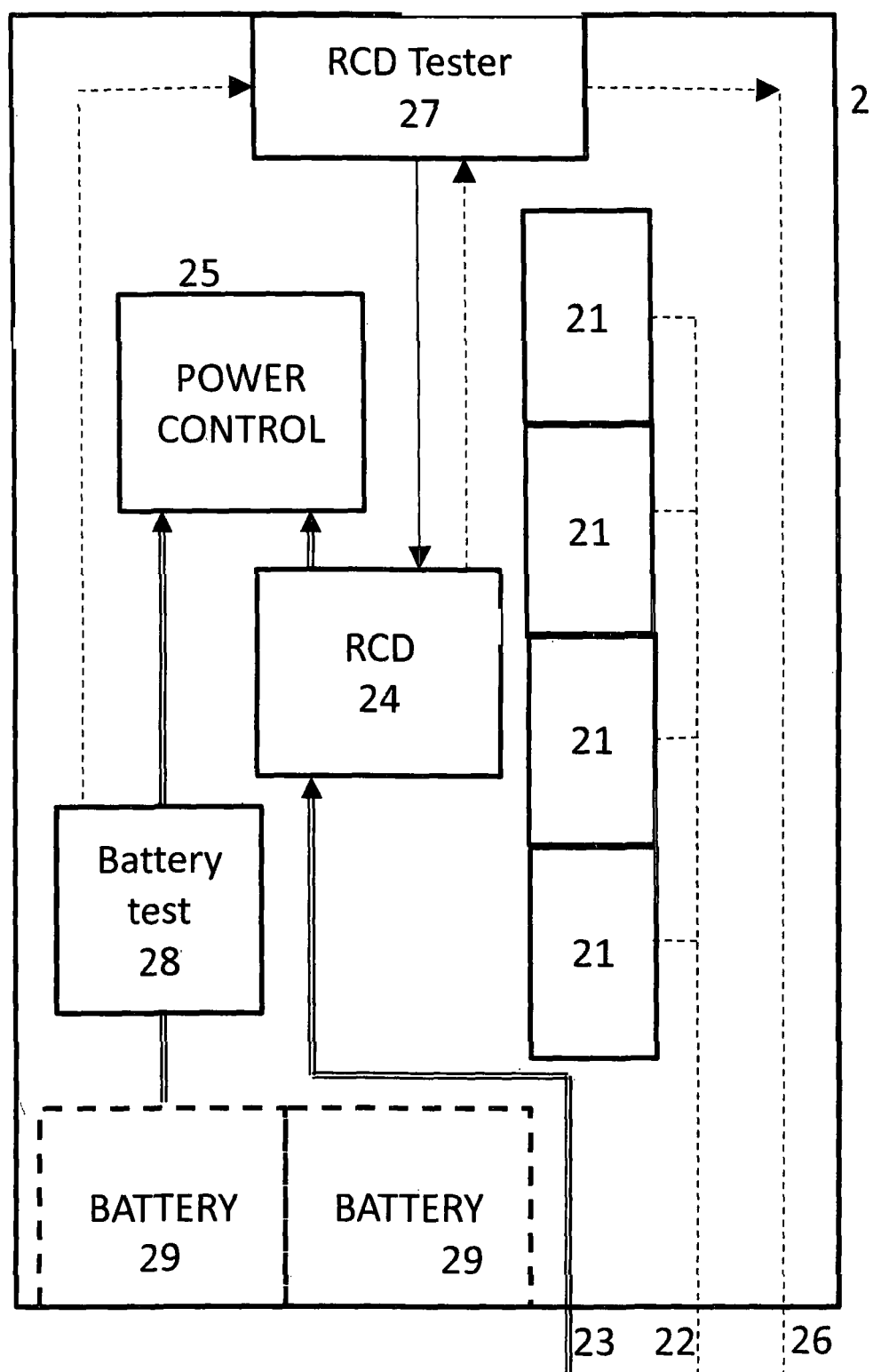
FIG. 1 is a schematic diagram of an equipment cabinet according to an embodiment, showing the components relevant to the invention and their inter-relationships.

FIG. 1 depicts an equipment cabinet 1 of the kind typically used to house telecommunications equipment in outdoor locations, acting as a distribution point at which a common feed 22 from a telecommunications network switching point is separated into separate feeds (not shown) to individual consumer premises. The connections are made through individual line cards 21.

In older systems the connections may be simple electrical connections, but in more modern systems the cards 21 may also be the interfaces between electrical ("copper") connections from the individual premises and an optical fiber distribution network 22. The conversion between electrical and optical signalling requires electrical power both to generate the electrical signals to be passed over the electrical domain and generate the optical signals to be fed into the optical fiber link 22. This therefore requires an electricity supply 23. Typically the electricity supply 23 is delivered through a standard electricity utility mains connection.

In order to maintain service in the event of an interruption in the electricity supply 23, a backup battery supply 29 is also provided. A power control system 25 delivers power from the battery 29 or mains supply 23 to the line cards 21, and also maintains the batteries 29 in a charged condition when the mains supply 23 is available. The power control system 25 includes the necessary equipment to convert between the relatively high voltage a.c supply delivered by the mains connection 23, the lower voltage d.c supply from the batteries 29, and the power rating required by the line cards.

Mains electricity is typically delivered at 110V or 230V, depending on the standards applicable in the region. There is a potential hazard that a live electrical component could become exposed, or come into contact with the external casing of the cabinet, should the cabinet be damaged. Such damage could be caused by accidental damage (e.g., by water ingress or physical damage to the cabinet) or by malicious interference. As well as the potential danger to personnel authorized to work on the cabinet, exposed "live" components are a potential hazard to members of the public, as these cabinets are typically in outdoor locations and often in locations accessible to the public.

To address this hazard, such cabinets are required to be fitted with a residual current detector (RCDs) 24 on the mains electricity feed 23. The RCD is designed to detect the current on both the "live" and "neutral" wires of the mains feed. If these currents do not balance, the RCD causes a switch to open, thus disconnecting the cabinet from the mains electricity supply. The imbalance in currents is indicative of a connection between the mains circuit and earth ("ground"), either through one of the customer telephone wires, or through the exterior of the cabinet 2, or through water ingress or some object (or person) that has made physical contact with the interior components of the cabinet. None of these situations are safe, but can be rendered safe by the activation of the RCD to cut off the electricity if a current imbalance is detected.

As the RCD is a safety device, many regulatory authorities require that it be tested periodically to ensure its correct operation. An RCD tester 27 has been developed that can be operated automatically, being triggered periodically to emulate a condition under which the RCD 24 would be activated, to check that the current has indeed been shut off, to re-set the RCD (i.e., to reconnect to the mains supply 23) and to transmit a report to a remote monitoring station over a communications link 26 indicative of the successful completion of this cycle.

Service can usually be maintained when the mains voltage supply 23 is disconnected, either during the RCD test, or following a real activation of the RCD, or following a failure of the mains supply 23 itself, using the low-voltage battery supply 29. If the failure is for a long duration, the services may be limited to essential "lifeline" communications in order to conserve battery power.

As the batteries 29 are required as a backup facility, most of them are rarely, if ever, required to deliver power. It is difficult to test them to ensure they are in working order as they are, in normal use, connected to a power supply, namely the control system 25, which maintains the required voltage across their terminals regardless of how much charge is actually stored in the battery, or how quickly it would be discharged.

Embodiments recognize that the RCD test provides an opportunity to test the battery condition, as the RCD test requires a temporary, and predictable, interruption of the mains supply 23 so that the battery is temporarily not on charge but is delivering power.

In embodiments, when the RCD tester 27 operates a test on the RCD 24, it also monitors the voltage detected by a voltmeter 28 connected across the terminals of the battery 29, and reports the results to the remote monitoring station over the communications link 26.

Figure 2:
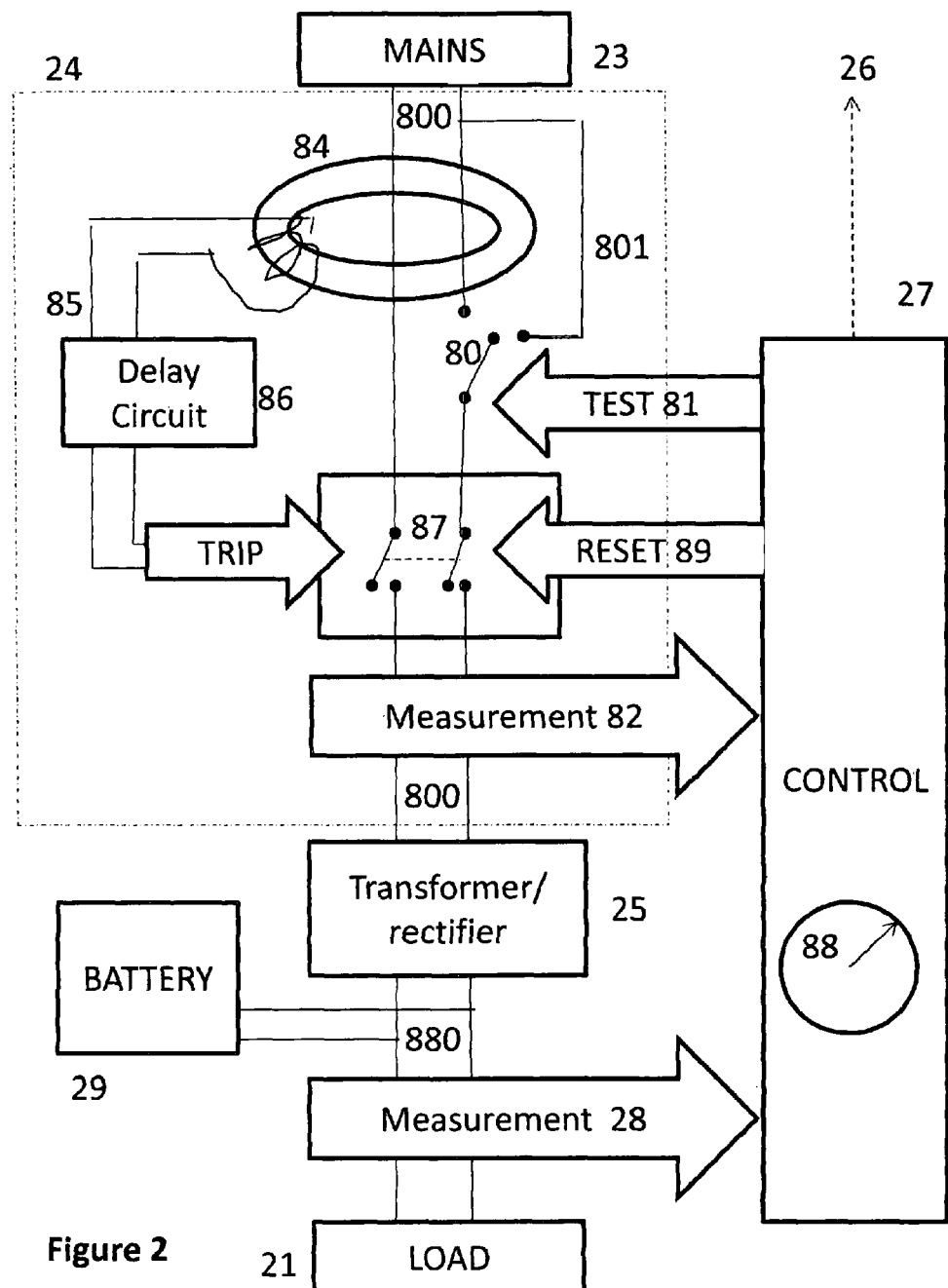
FIG. 2 is a schematic diagram showing more detail of some of the components in FIG. 1.

FIG. 2 is a schematic diagram demonstrating the principle of operation of the residual current device and the testing system.

The residual current device 24 has a connection to an alternating current mains electricity supply 23 and in normal use comprises a circuit 800 connected to a power management system 23 including a transformer/rectifier 25 for converting the alternating current to low-voltage direct current in a d.c circuit 880 providing power to an electrical load 21. The RCD 24 comprises a detection system comprising an induction loop 84. In normal use the current in both arms of the circuit 800 passes through the loop 84 in opposite directions, thus resulting in a nil net magnetic field. However, if a short circuit or other electrical fault results in one arm of the circuit 800 carrying less current than the other, a field is induced in the loop 84 inducing a current in a detection circuit 85, causing an electrically activated switch 87 to open and disconnect the rest of the equipment 21, etc., from the mains supply. A delay system 86 may be built in to the detection circuit 85 to prevent transient surges from triggering the RCD. Similarly, the switch 87 may be arranged to only respond to a current in the detection circuit above a predetermined threshold.

The RCD can be tested by operation of a test actuator 81, again in this embodiment controlled remotely, to cause a switch 80 to connect a shunt 801 in circuit, such that only one of the arms of the circuit 800 passes through the detection coil 84. This therefore simulates the condition the RCD 24 is designed to detect, and causes the switch 87 to be tripped.

A measurement unit 82 measures the voltage across the circuit 800 and the output from the measurmeent unit is retuned to the control unit to determine if the RCD test has operated to specification. The measurements reported include the delay time for the switch to operate.

Although shown as a binary switch 80, the connection to the shunt 801 may be a variable switch such as a potentiometer arranged such that the proportion of the current passing through the circuit 800 which is routed through the shunt 801 can be varied, in order to ascertain at what level of residual current difference the trip switch 87 is activated.

A reset actuator 89 is provided to return the trip switch 87 to the closed position. In embodiments this reset actuator 89 is controlled remotely, over a communications connection 26, through a processing unit 27. If the tripping was the result of a test, the reset function also resets the shunt switch 80.

When the RCD 24 is tripped, either as a test or otherwise, the operational components 21 of the cabinet (including the control functions 27) are powered by a battery 29, connected into the dc circuit 880. When the trip switch 87 is reset and the ac supply is restored, the load is powered from the ac supply 23 through the circuits 800 880, and the battery 29 is recharged through the dc connection.

As described above, it is normally difficult to monitor the condition of the batteries remotely, because the voltage measured across its terminals (at 83) is maintained by the output of the ac/dc converter 25, regardless of the actual condition of the battery.

In embodiments, the voltage at the dc circuit 880 is monitored whilst the ac circuit 800 is tripped (i.e., the switch 87 is open), to determine the condition of the battery 29. The control system 27 is arranged to maintain the switch 87 in the tripped position until the battery test is complete.

Figure 3:
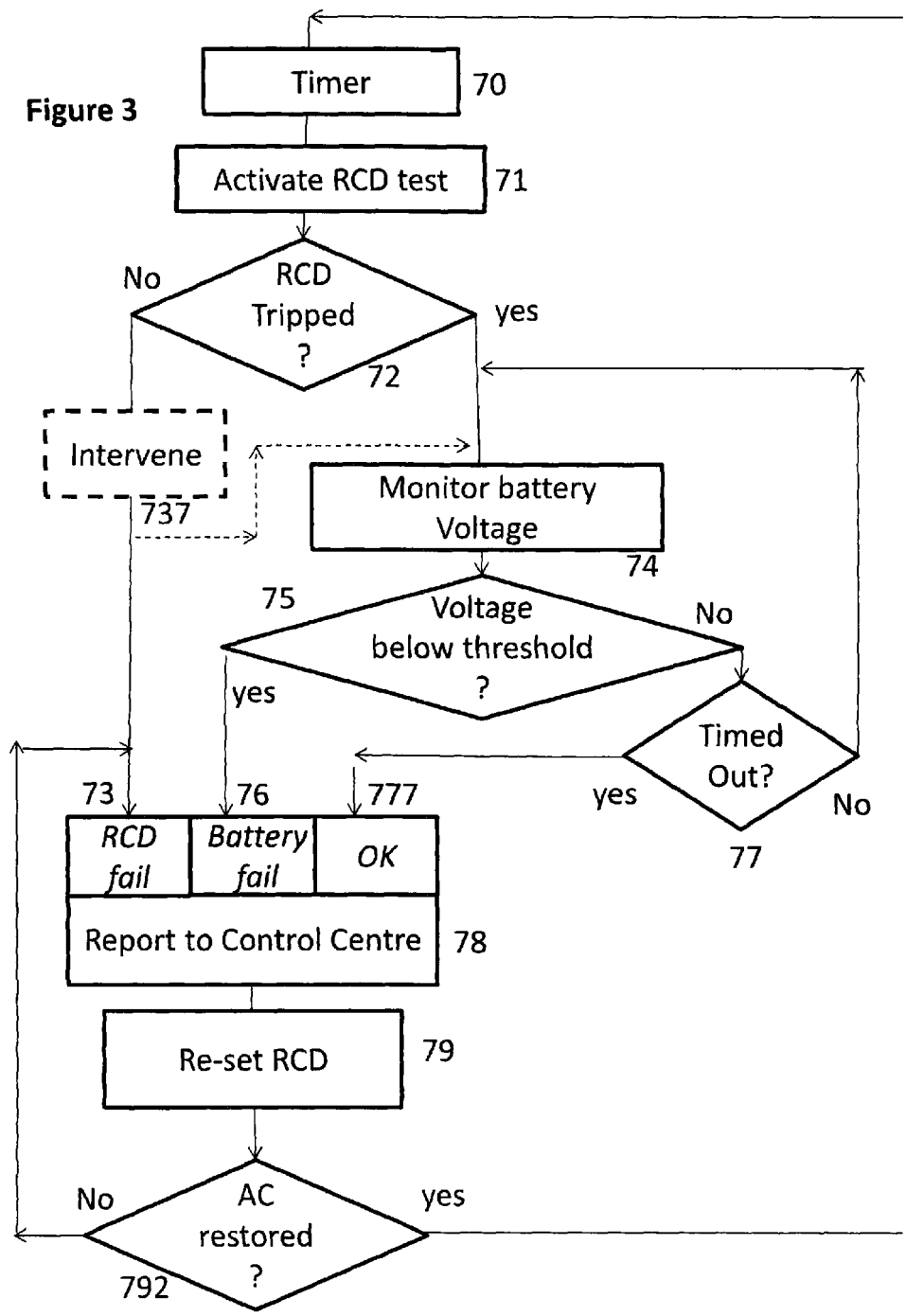
FIG. 3 is a flow diagram indicative of a process operating according to an embodiment.

The operation of an embodiment will now be described in more detail with reference to FIG. 3.

The process is initiated either by a signal from a remote control center or, as shown, in response to a timer (70) set to start the process periodically, for example at the intervals specified for RCDs to be tested.

The RCD tester 27 first triggers the RCD 24 (at 71) by operating the actuator 81 to the switch 80 to connect the shunt 801. This should cause the trip switch 87 to be activated, and thus cause the voltage measured at 82 to drop to zero. If the RCD has not tripped (at 72) and the voltage 82 remains high, the control unit 27 transmits an alert 73 (at 78) over the communications network 26 to the remote control center to indicate that the unit requires attention.

The control unit 27 monitors the voltage measured at 82 during the test to determine at what moment the switch trips, and thereby determine whether the delay circuit 86 is operating correctly. If the switch 80 is a variable (non-binary) one, the trigger point detected at 82 may also be measured against the switch position (residual current) at which the trip circuit 84, 85, 86, 87 is triggered. Alerts 73 may also be sent if the measurement unit 82 detects that the unit 24 is operating outside its specified parameters, for example if the residual current required to actuate the trip switch 87 is greater or less than specification, or the reaction time caused by the delay circuitry 86 is faster or slower than required.

Until the RCD 24 is tripped, there is a dc output from the transformer/rectifier 25 to the DC circuit 880. The load 21 draws power from the transformer, and the power supply also maintains the charge in the battery 29. When the RCD 24 is successfully tripped, there is no longer an AC input 800 to the transformer/rectifier 25 and consequently the DC circuit 880 is isolated from external power sources, so the load 21 starts to draw power from the battery 29.

The control unit 27 monitors the voltage 28 measured across the dc circuit 880 to determine the condition of the battery (at 74). If the voltage drops below a predetermined threshold value (at 75) the control unit 27 transmits an alert 76 (at 78) over the communications network 26 to the remote control center to indicate that the battery requires attention.

If the battery is in good condition, a timer 88 in the control unit will time out (at 77) without the voltage 28 falling below the threshold. The control unit 27 transmits a message 777 (at 78) over the communications network 26 to the remote control center to indicate that the RCD and battery have both successfully passed the tests.

In this embodiment, the battery is only tested if the RCD is successfully tripped. An RCD failure generally requires a site visit to investigate, at which time the battery may be checked as well. However, as shown in dotted lines in FIG. 3, it is possible to arrange for the control unit 27 to open the switch 87 directly (step 737) (i.e., without using the trip system 80, 84, 85, 86) in order to allow the battery 29 to be tested even if the RCD 24 has failed.

After the control unit 27 has determined the condition of the RCD 24 and/or the battery 29, the control unit 27 operates the actuator 81 for the shunt switch 80 and a re-set actuator 89 for the trip switch 87 to restore the RCD 24 to its normal operative condition (at 79). Typically a further measurement 792 is then made by the test unit 82 to check that the RCD 24 has correctly reset and that there is power on the mains (AC) side 800 of the power control system 25.

The invention claimed is:

1. Apparatus for installation in an electrical equipment cabinet, comprising:
   a connection to a mains electricity supply, the mains electricity supply arranged to provide power to equipment in the electrical equipment cabinet;
   a connection to a battery, the battery arranged to power the equipment in the electrical equipment cabinet;
   a residual current detection device for monitoring the mains electricity connection and for disconnecting the mains electricity supply in the event of detection of an imbalance between the current detected in different parts of the mains electricity connection;
   a test actuator for triggering the residual detection device, such that the mains electricity supply is disconnected from the battery;
   a residual current device (RCD) monitor for monitoring the operation of the residual current detection device when activated by the test actuator;
   a battery condition detector for monitoring the battery connection to determine a condition of a battery connected thereto; and
   a control system for transmitting, to a remote location, a signal comprising an indication of the operation of the residual current detected device and the battery condition in response to the test actuator triggering the residual current detection device to disconnect the mains electricity supply from the battery.

2. Apparatus according to claim 1, wherein the control system is arranged to monitor a battery voltage, detected by the battery condition detector, over a pre-determined time period initiated by triggering the test actuator and to transmit an alarm signal if the battery voltage falls below a threshold value within the pre-determined time period.

3. The apparatus according to claim 1, wherein a reset actuator is configured to reset the residual current detection device when a pre-determined time period has elapsed after triggering the residual current detection device, and wherein the control system is configured to reset the residual current detection device to restore the connection to the mains electricity supply if a battery voltage detected by the battery condition detector falls below a threshold value before the pre-determined time period has elapsed.

4. The apparatus according to claim 1, further comprising an actuator to disconnect the mains electricity supply in the event that the test actuator fails to trigger the residual current detection device.

5. A method for operating electrical equipment, comprising:
   activating a test actuator for a residual current detection device such that a mains electricity supply to the equipment is disconnected; and
   monitoring the operation of the residual current detection device;
   wherein, when the residual current detection device is activated, the equipment draws electrical power from a battery,
   a battery condition is monitored whilst the equipment is drawing power from the battery, and
   a signal comprising an indication of the operation of the residual current detection device and the battery condition is transmitted to a remote location.

6. The method according to claim 5, wherein the battery condition is monitored over a period of time initiated by the operation of the test actuator.

7. The method according to claim 6, wherein an alarm signal is transmitted to the remote location if the battery condition falls below a threshold value within the period of time.

8. The method according to claim 5, wherein a reset actuator causes the residual current detection device to be reset when a period of time has elapsed after activation of the test actuator, and wherein, if the battery condition falls below a threshold value before the period of time has elapsed, the residual current detection device is reset to reconnect the equipment to the mains electricity supply.

9. The method according to claim 5, wherein if the test actuator fails to operate the residual current detection device, an alarm is transmitted to the remote location and a further actuator disconnects the mains electricity supply directly.

* * * * *